(12) United States Patent
Colgan et al.

(10) Patent No.: US 6,396,151 B1
(45) Date of Patent: *May 28, 2002

(54) PARTIALLY-OVERLAPPED INTERCONNECT STRUCTURE AND METHOD OF MAKING

(75) Inventors: Evan George Colgan, Suffern, NY (US); Jeffery Peter Gambino, Gaylordsville, CT (US); Kenneth Parker Rodbell, Poughguag, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 22 days.

(21) Appl. No.: 09/027,041

(22) Filed: Feb. 20, 1998

Related U.S. Application Data

(63) Continuation of application No. 08/661,506, filed on Jun. 11, 1996, now abandoned.

(51) Int. Cl.[7] .............................................. H01L 23/52
(52) U.S. Cl. ......................... 257/762; 257/765; 257/771
(58) Field of Search ................................. 257/765, 771, 257/762

(56) References Cited

U.S. PATENT DOCUMENTS

| | | | | |
|---|---|---|---|---|
| 4,668,335 A | * | 5/1987 | Mockler et al. ............ | 156/643 |
| 4,925,524 A | * | 5/1990 | Beatty ........................ | 156/643 |
| 5,071,714 A | * | 12/1991 | Rodbell et al. ............. | 428/620 |
| 5,143,820 A | * | 9/1992 | Kotecha et al. ............. | 430/314 |
| 5,225,040 A | * | 7/1993 | Rohner ........................ | 156/652 |
| 5,256,597 A | * | 10/1993 | Gambino ..................... | 438/642 |
| 5,355,020 A | * | 10/1994 | Lee et al. .................... | 257/741 |
| 5,565,707 A | * | 10/1996 | Colgan et al. .............. | 257/762 |

FOREIGN PATENT DOCUMENTS

| | | | | |
|---|---|---|---|---|
| JP | 60-245252 A | * | 12/1985 | ................ 257/762 |
| JP | 5-47760 A | | 2/1993 | |
| JP | 8-102463 A | | 4/1996 | |
| JP | 8-298285 A | | 11/1996 | |
| JP | 9-20942 A | | 1/1997 | |
| JP | 9-186157 A | | 7/1997 | |
| JP | 10-223635 A | | 8/1998 | |
| JP | 11-054458 A | | 2/1999 | |

* cited by examiner

*Primary Examiner*—Allan R. Wilson
(74) *Attorney, Agent, or Firm*—Robert M. Trepp; Randy W. Tung

(57) ABSTRACT

The present invention is concerned with an interconnect structure for providing electrical communication between an interconnect and a contact in a semiconductor device which includes a contact formed of aluminum or aluminum-copper, an aluminum-copper alloy film which is capable of substantially preventing the contact from being etched by an etchant and which covers substantially the contact, and an interconnect line formed of aluminum or aluminum-copper which at least partially covers the aluminum-copper film sufficient to provide electrical communication between the interconnect line and the contact. The present invention also provides a method for fabricating such interconnect structure.

10 Claims, 1 Drawing Sheet

PARTIALLY-OVERLAPPED INTERCONNECT STRUCTURE AND METHOD OF MAKING

This is a continuation of application Ser. No. 08/661,506 filed on Jun. 11, 1996 now abandoned.

FIELD OF THE INVENTION

The present invention generally relates to an interconnect structure and more particularly, relates to an interconnect structure consisting of a contact and an interconnect line having an alloy film formed thereinbetween as an etch-stop during the interconnect line forming process.

BACKGROUND OF THE INVENTION

In modern VLSI and ULSI semiconductor devices, the dimensions of the devices are continuing to shrink. In order to allow more devices to be built on the same size real estate, the vertical dimension of the semiconductor devices has been increased. The increasing vertical dimension of the devices requires more levels of metal interconnection to be built in order to connect the various devices on a chip. These metal interconnections, for instance, include local interconnects or straps which electrically connect closely spaced devices. The technology for fabricating multiple levels of metal interconnects therefore has become more important.

The fabrication of a metal interconnect generally involves the blanket deposition of a metal conductive layer over the devices to be connected and then photomasking and etching the metal layer to form the interconnects. Both wet etching and reactive ion etching (RIE) techniques are used in etching the metal interconnects. The wet etching technique provides a desirable etch rate ratio (ERR) or a high selectivity for the metal not to be etched such that minimal damage is done to the underlying features on the chip. Since wet etching is isotopic in nature, the precise control of a submicron-level etching in high density integrated circuits is difficult. The reactive ion etching technique, on the other hand, is anisotropic in nature and therefore is more preferred in forming interconnects and studs in VLSI or ULSI devices. The RIE technique is more effective in controlling submicron dimensions on high density devices.

Referring initially to FIG. 1, where an enlarged, cross-sectional view of a conventional interconnect structure 10 of a semiconductor device is shown. The interconnect structure 10 is built on a silicon substrate 12 which has active regions 14 and 16 of either P or N type. The device is similar to a field-effect-transistor (FET) formed on a gate oxide insulation layer 22 on silicon substrate 12. A first level contact studs 18 and 20 are formed on the active regions 14 and 16 in the thick oxide insulation layer 24. The contact studs 18 and 20 connect the semiconductor device to first level metal lines 26 and 28 that are formed in a first level metalization layer (not shown). The contact studs 18 and 20 can be formed of tungsten with titanium or titanium/titanium nitride layers surrounding the studs. After the interconnect lines 26 and 28 are covered by a second thick oxide insulation layer 32, contact holes are opened through a photolithography and an etching process to form second level contact studs 34 and 36. After a planarization process is carried out to form a smooth surface 38, second level interconnect lines (or plugs) 42 and 44 can be built onto the device.

A currently used interconnect structure such as that shown in FIG. 1 can be formed by an aluminum-based metalization process consisting of titanium layers over and under, titanium nitride cap lines and tungsten studs. The illustrated interconnect structure has a number of disadvantages of which most notably is the low electromigration resistance of the Al lines adjacent to the tungsten studs. Since tungsten studs act as a complete barrier to copper and aluminum transport, this results in copper depletion in Al areas adjacent to the studs. The copper depletion in turn leads to an electromigration open failure in the Al. To avoid this problem, a set of down stream ground rules that are based on reliability data are required. These rules limit the performance of advanced CMOS logic chips.

A solution to this interconnect problem is therefore to replace the tungsten stud with a low resistivity material, such as aluminum, through which aluminum or copper can diffuse. An obvious problem in using aluminum studs is that during a subsequent etching step for forming the interconnect lines overlying the studs, a misalignment in the photomasking process may result in partially covered studs which during the etching process, can be etched away by the etchant used for etching the interconnect line. This creates voids in the aluminum studs and will possibly lead to the failure of the studs.

Others have attempted to solve the problem by proposing various solutions. For instance, U.S. Pat. No. 4,925,524 to Beatty discloses a method of using a chromium layer as an etch stop. The chromium layer is removed with an oxygen/chlorine plasma which has high selectivity to silicon oxide. However, it is also known that chlorine is highly effective in etching away aluminum. U.S. Pat. No. 4,668,335 to Mockler, et al concerns an aluminum reactive ion etching technique that stops at a layer of titanium tungsten. The etch stop layer of titanium tungsten is then removed in a wet etching process. The method has the drawback that, for submicron dimensions in high density devices, lateral etching of titanium tungsten by a wet etch method can result in severe damage to the metal interconnect lines. U.S. Pat. No. 5,256,597 to Gambino et al. discloses the use of a self aligned conducting etch-stop for interconnect patterning. However, in this method, a sacrificial alloying layer must first be deposited on a conductive etch-stop layer before an interconnect layer can be deposited and thus requiring an extra processing step which is costly and time-consuming.

In a copending application Ser. No. 08/332,328 assigned to the common assignee of the present invention which is incorporated here in its entirety by reference, an interconnect structure for an integrated circuit for resisting electromigration when high current densities pass through the interlayer contact regions of the structure is disclosed. The structure includes interconnect lines formed of a metal of copper, copper alloys, aluminum or aluminum alloys over a via or stud formed of an aluminum-copper alloy. An aluminum-copper alloy is used in the stud in order to (1) avoid the etching away of the stud during an etching process for the interconnect lines overlying the stud when the stud is only partially covered by the line, (2) eliminate the highly resistive tungsten vias, and (3) allow for diffusion of aluminum and copper through the $Al_2Cu$ via (stud). It would be more desirable if aluminum can be used in the stud based on its lower resistivity characteristics.

It is therefore an object of the present invention to provide an interconnect structure for providing electrical communication between an interconnect and a contact that does not have the drawbacks and shortcomings of conventional interconnect structures.

It is another object of the present invention to provide an interconnect structure for providing electrical communication between an interconnect and a contact that allows a metal line to only partially overlap a metal stud during the fabrication process.

It is a further object of the present invention to provide an interconnect structure for providing electrical communication between an interconnect and a contact that can be fabricated by a self-aligning method in which an etch-stop layer is built on an aluminum stud.

It is another further object of the present invention to provide an interconnect structure for providing electrical communication between an interconnect and a contact wherein a complete overlap of the contact by the interconnect is not necessary.

It is yet another object of the present invention to provide an interconnect structure for providing electrical communication between an interconnect and a contact wherein an undesirable etching of the contact by an interconnect etching process can be avoided.

It is still another object of the present invention to provide an interconnect structure for providing electrical communication between an interconnect and a contact wherein an alloy film of aluminum-copper is formed to substantially cover the upper surface of the contact.

It is still another further object of the present invention to provide a semiconductor structure consisting of a contact formed of aluminum or aluminum-copper, an aluminum-copper film that substantially covers the contact, and an interconnect line formed of aluminum or aluminum-copper which at least partially covers the aluminum-copper film.

It is yet another further object of the present invention to provide a method for fabricating an interconnect line on a contact in a semiconductor device by first forming an alloy film to substantially cover the contact such that the contact aluminum will not be etched by an etchant in a subsequent process for forming the interconnect line.

SUMMARY OF THE INVENTION

In accordance with the present invention, an interconnect structure which has an interconnect that only partially overlaps a contact in a semiconductor structure and a method of making such interconnect structure are provided.

In a preferred embodiment, an interconnect structure for providing electrical communication between an interconnect and a contact in a semiconductor device is provided which includes a contact made of a first metallic material, an alloy film which substantially covers the contact, and an interconnect line of a second metallic material which at least partially covers the alloy film. In the structure, the first and the second metallic materials can be selected from aluminum, aluminum alloys, copper, copper alloys, gold, gold alloys, silver and silver alloys. A suitable alloy film to be used over an aluminum or aluminum-copper stud is an aluminum-copper film. The contact fabricated in the semiconductor device is generally a via or a stud connecting between two interconnect lines. The interconnect line and the contact are generally formed in a layer of insulating material such as silicon oxide, silicon nitride, low dielectric constant polymer or silicon oxynitride. The alloy film of aluminum-copper can be formed by first blanket depositing a copper layer on the device covering an aluminum stud and then annealing to form the alloy layer overlying the stud. Utilizing the high etch rate ratio (ERR) of a wet etchant to remove the unreacted copper layer, the alloy film of aluminum-copper substantially prevents an aluminum stud from being etched by the etchant in a subsequent interconnect forming process. The present invention allows an interconnect line to only partially covers an alloy film that overlies a stud sufficient to provide electrical communication between the interconnect line and the stud.

The present invention further provides a method for fabricating an interconnect line on a contact in a semiconductor device by the steps of first forming a contact of a first metallic material, then forming an alloy film to substantially cover the contact where the alloy film is capable of preventing the contact from being etched by an etchant in a subsequent interconnect line forming process, and forming an interconnect line of a second metallic material to at least partially cover the alloy film sufficient to provide electrical communication between the contact and the interconnect line.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides an interconnect structure for providing electrical connection between an interconnect and a contact in a semiconductor device and a method of making such structure. There are several benefits made possible by the present invention structure and method. Firstly, the structure allows a partially-overlapped metal line to be formed on a metal stud without the disadvantage of letting the metal stud be etched away in a subsequent etching process for forming the interconnect lines. Secondly, the present invention is a self-aligned method of forming an alloy film on a metal stud such that the metal stud is completely covered by the alloy film which is subsequently used as an etch-stop. Chip real estate savings can be realized since only the top surface of the metal stud needs to be covered by the etch-stop layer and one does not have to enlarge the stud and line intersection areas in order to avoid partial overlap. Thirdly, the alloy etch-stop layer can also be used to aid in subsequent photolithography processes for forming the interconnect lines since the alloy etch-stop layer provides enhanced contrast due to slight local topography differences. Fourthly, when an aluminum-copper alloy is used as the etch-stop layer on an aluminum stud, the aluminum stud and an aluminum interconnect line subsequently formed on top of the etch-stop layer can both be doped by copper ions to provide improved electromigration and stress voiding resistance.

Figure 1:
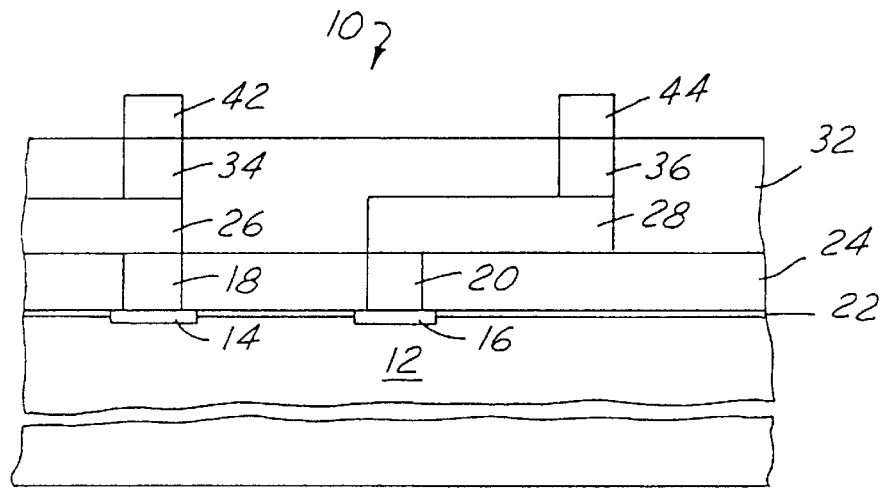
FIG. 1 is an enlarged, cross-sectional view of a conventional semiconductor device having multiple layers of interconnect structure.
Figure 2A:
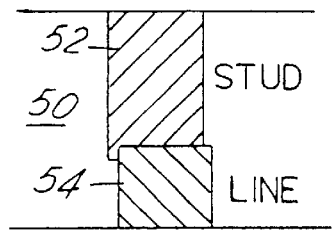
FIG. 2A is an enlarged, cross-sectional view of the present invention interconnect structure prior to the deposition of a copper layer.

It should be noted that the interconnect structure shown in FIG. 1 is an ideal structure that cannot normally be obtained in a semiconductor fabrication process. In a real fabrication process, there is always misalignment during the photolithography process and therefore, a stud and an interconnect line are not perfectly aligned. As shown in FIG. 2A, stud 52 and line 54 are misaligned due to misalignment in the photolithography process.

Figure 2B:
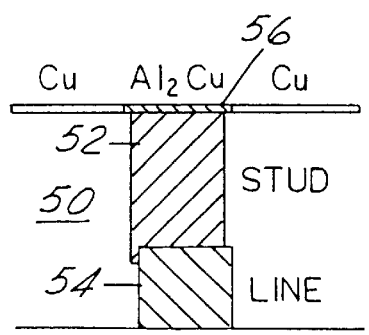
FIG. 2B is an enlarged, cross-sectional view of the present invention interconnect structure having a copper layer deposited on top and annealed to form a self-aligned aluminum-copper alloy.

The present invention interconnect structure consists of a layer of self-aligned $Al_2Cu$ layer on top of an aluminum or aluminum-copper stud to serve as an effective etch-stop in a reactive ion etching (RIE) process. In a preferred embodiment, the process can be carried out by the following steps. First, as shown in FIG. 2A, after an aluminum or aluminum-copper stud fill and a chemical mechanical polishing process, a layer of copper having a thickness between about 10 nm and about 50 nm is deposited onto the wafer. This is shown in FIG. 2B. The wafer is then annealed at a temperature between about 250° C. and about 350° C., and preferably between about 280° C. and about 320° C. for an annealing time of approximately 0.5~3 hours. Copper is alloyed with the aluminum or the aluminum-copper stud underneath to form $Al_2Cu$ in the annealing process. Since only the copper film that is immediately adjacent to the stud is transformed into an alloy, the present invention process provides a self-aligned method to form an etch-stop film on top of the stud. Next, the unreacted copper is removed by a wet etch method with an acid solution such as $HNO_3/H_2O$ of approximately 10% concentration. The specific etchant solution has a high selectivity for copper, i.e., the etch rate ratios (ERR) are very favorable. For instance, the ERR for Cu/Al is approximately 150 to 1 and for $Cu/Al_2Cu$ is approximately 35 to 1. The unreacted copper layer can be completely removed with minimal or no damage to the etch-stop layer of $Al_2Cu$. Other acidic based etchant systems used in wet etch or a RIE process may also work satisfactorily in the present invention method.

Figure 2C:
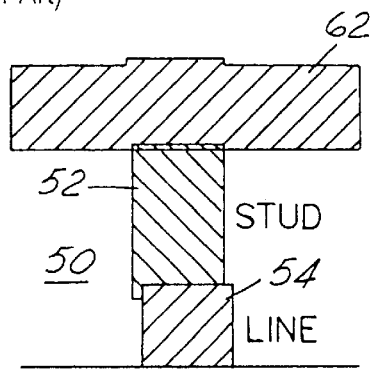
FIG. 2C is an enlarged, cross-sectional view of the present invention interconnect structure having an aluminum blanket layer deposited on top.
Figure 2D:
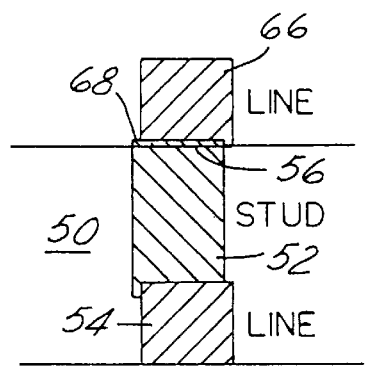
FIG. 2D is an enlarged, cross-sectional view of the present invention interconnect structure wherein the aluminum layer is etched to form an interconnect line which partially overlaps the alloy layer.

In the next fabrication step, a second level interconnect line is built on top of stud 52 and the etch-stop film 56. Aluminum layer 62 is blanket deposited on top of the wafer 50 and then patterned by a photolithography process and etched in a reactive ion etching process. This is shown in FIGS. 2C and 2D. It is seen in FIG. 2D that even though there is a misalignment in the photolithography process for laying out the interconnect line 66, the misalignment 68 would not cause any etching of the aluminum or the aluminum-copper stud 52 underneath. This is because the ERR of the reactive ion etching process is very high between $Al_2Cu/Al$, and therefore, the aluminum of the interconnect layer is removed without etching the stud 52 which is shielded by the etch-stop layer 56 of $Al_2Cu$. The interconnect line 66 therefore forms even for the case of a partially overlapped stud 52, however this is sufficient to provide electrical communication between the interconnect and the stud.

Finally, an annealing process conducted at a temperature range between about 310° C. and about 450° C., preferably between about 380° C. and 420° C., disperses the $Al_2Cu$ into both the underlying stud and the patterned metal interconnect line 66 on top to produce a homogeneous aluminum-copper alloy. The copper ions dispersed into the aluminum phase greatly enhance the electromigration resistance of the alloy. The presence of copper ions in aluminum also improves the stress voiding resistance of the alloyed stud and interconnect line. It should be noted that during the photolithography process for patterning the interconnect line 66, the etch-stop layer of $Al_2Cu$ can also be used as an anti-reflection coating over the aluminum stud 52.

The present invention method therefore provides a stud that is covered with a $Al_2Cu$ cap layer as a source of copper for the stud and for the interconnect line formed on top. The method increases the electromigration lifetimes of both the studs and the lines. Presently, the copper concentration in the line levels is limited to less than 2 wt % in fabrication, due to the difficulty of removing $Al_2Cu$ particles which is present in aluminum-copper alloys with larger than 0.5 wt % copper solute additions by a reactive ion etching process. Moreover, the present invention interconnect structure allows for improved alignment to subsequent levels because of the local topology differences between the $Al_2Cu$ coated vias and the planarized dielectric. The theta-phase $Al_2Cu$ can be in equilibrium with the aluminum at less than 2 wt % concentration in copper interconnect lines and therefore will dissolve to satisfy the aluminum-copper solubility requirement. This is found to be beneficial since the theta-phase $Al_2Cu$ will serve as a copper source for the aluminum-copper studs and lines to result in enhanced electromigration behavior. The self-aligned feature of the present invention interconnect structure further allows one skilled in the art to greatly improve the design rules since fully covered studs are no longer necessary.

While the present invention has been described in an illustrative manner, it should be understood that the terminology used is intended to be in a nature of words of description rather than a limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An electronic structure for providing electrical communication between an interconnect line and a contact stud in a semiconductor device comprising:
    a contact stud of a first metallic material;
    an etch-stop layer of an alloy film that comprises aluminum completely covers said contact stud; and
    an interconnect line of a second metallic material situated on top of said alloy film wherein said alloy film only partially covers said interconnect line, wherein said first and said second metallic materials are selected from the group consisting of copper, copper alloys, gold, gold alloys, silver and silver alloys.

2. An interconnect structure according to claim 1, wherein said first and said second metallic materials are the same.

3. An interconnect structure according to claim 1, wherein said alloy film is aluminum-copper.

4. An interconnect structure according to claim 1, wherein said contact is a stud providing electrical communication between said interconnect line and a second interconnect line.

5. An interconnect structure according to claim 1, wherein said interconnect line and said contact are formed in an insulating material.

6. An interconnect structure according to claim 1, wherein said alloy film is formed by first depositing a copper layer on an aluminum contact and then annealing to form an alloy.

7. An interconnect structure according to claim 1, wherein said alloy film is capable of substantially preventing the contact from being etched by an etchant.

8. A semiconductor structure comprising:
    a contact stud formed of aluminum or aluminum-copper;
    an aluminum-copper film for preventing the contact from being etched by an etchant covers said contact; and
    an interconnect line formed of aluminum or aluminum-copper situated on top of said aluminum-copper film to provide electrical communication between said interconnect line and said contact wherein said aluminum-copper film only partially covers said interconnect line.

9. A semiconductor structure according to claim 8, wherein said contact and said interconnect line are formed of aluminum.

10. A semiconductor structure according to claim 8, wherein said aluminum-copper film is an etch-stop film sufficient to prevent said contact from being etched by an etchant during an etching process for said interconnect line.

\* \* \* \* \*